United States Patent
Ngo et al.

(10) Patent No.: US 7,298,176 B2
(45) Date of Patent: Nov. 20, 2007

(54) DUAL-GATE DYNAMIC LOGIC CIRCUIT WITH PRE-CHARGE KEEPER

(75) Inventors: Hung C. Ngo, Austin, TX (US); Ching-Te Chuang, South Salem, NY (US); Keunwoo Kim, Somers, NY (US); Jente B. Kuang, Austin, TX (US); Kevin J. Nowka, Georgetown, TX (US)

(73) Assignee: International Business Machines Corporation, Armonk, NY (US)

( * ) Notice: Subject to any disclaimer, the term of this patent is extended or adjusted under 35 U.S.C. 154(b) by 133 days.

(21) Appl. No.: 11/204,401

(22) Filed: Aug. 16, 2005

(65) Prior Publication Data

US 2007/0040584 A1 Feb. 22, 2007

(51) Int. Cl.
*H03K 19/20* (2006.01)
(52) U.S. Cl. .............................. 326/119; 326/93; 326/27
(58) Field of Classification Search .................. 326/80, 326/81, 93–98, 112, 119, 121
See application file for complete search history.

(56) References Cited

U.S. PATENT DOCUMENTS 6,204,696 B1 * 3/2001 Krishnamurthy et al. ..... 326/98
6,429,684 B1 * 8/2002 Houston ....................... 326/83
6,600,340 B2 * 7/2003 Krishnamurthy et al. ..... 326/98

OTHER PUBLICATIONS

Keunwoo, et. al., "Double-Gate CMOS: Symmetrical-Versus Asymmetrical-Gate Devices," *IEEE Transaction on Electron Devices*, vol. 48, No. 2, Feb. 2001, pp. 294-299.
Chiang, et. al., "Novel High-Density Low-Power High-Performance Double-Gate Logic Techniques," *2004 IEE International SOI Conference, Charleston, SC*, Oct. 4-7, 2004, pp. 122, 123.
"Taurus-MEDICI, Industry-Standard Device Simulation Tool," Mountain View, CA, *Synopsis, Inc.*, 2003, pp. 1-7, no month.

* cited by examiner

*Primary Examiner*—Don Le
(74) *Attorney, Agent, or Firm*—Winstead PC

(57) ABSTRACT

A dynamic logic gate has an asymmetrical dual-gate PFET device for charging a dynamic node during a pre-charge phase of a clock. A logic tree evaluates the dynamic node during an evaluate phase of the clock. The front gate of the asymmetrical dual-gate PFET device is coupled to the clock signal and the back gate is coupled to the ground potential of the power supply. When the clock is a logic zero both the front gate and the back gate are biased ON and the dynamic node charges with maximum current. The clock signal transitions to a logic one during the evaluation phase of the clock turning OFF the front gate. The back gate remains ON and the asymmetrical dual-gate PFET device operates as a keeper device with a current level sufficient to counter leakage on the dynamic node.

20 Claims, 5 Drawing Sheets

DUAL-GATE DYNAMIC LOGIC CIRCUIT WITH PRE-CHARGE KEEPER

GOVERNMENT RIGHTS

This invention was made with Government support under PERCS II, NBCH3039004, BGR W0132280. THE GOVERNMENT HAS CERTAIN RIGHTS IN THIS INVENTION.

TECHNICAL FIELD

The present invention relates to dynamic logic circuits, and in particular, to dynamic logic circuits using a keeper for holding the state of the dynamic node.

BACKGROUND INFORMATION

Modern data processing systems may perform Boolean operations on a set of signals using dynamic logic circuits. Dynamic logic circuits are clocked. During the precharge phase of the clock, the circuit is preconditioned, typically by precharging an internal node (dynamic node) of the circuit by coupling to a power supply rail. During an evaluate phase of the clock, the Boolean function being implemented by the logic circuit is evaluated in response to the set of input signal values appearing on the inputs during the evaluate phase. (For the purposes herein, it suffices to assume that the input signals have settled to their "steady-state" values for the current clock cycle, recognizing that the input value may change from clock cycle to clock cycle.) Such dynamic logic may have advantages in both speed and the area consumed on the chip over static logic. However, the switching of the output node with the toggling of the phase of the clock, each cycle may consume power even when the logical value of the output is otherwise unchanged.

This may be appreciated by referring to FIG. 1 illustrating an exemplary three-input OR dynamic logic gate. Dynamic logic 100 includes three inputs A, B and C coupled to a corresponding gate of N channel field effect transistors (NFETs) 101-103. During an evaluate phase (logic one) of clock 104, NFET 106 is turned ON, and if any of inputs A, B or C are a logic one, dynamic node 108 is pulled low (logic zero), and OUT transitions to a logic one via inverter 110. During the precharge phase (logic zero) of Clk 104, dynamic node 108 is precharged to a logic one via P channel field effect transistor (PFET) 112. Half-latch PFET 114 maintains the charge on dynamic node 108 through the evaluate phase unless one or more of inputs A, B or C is turned ON. Consequently, dynamic node 108 undergoes two discharge-precharge cycles. OUT similarly undergoes two discharge-precharge cycles, albeit with opposite phase. Because OUT is discharged during the precharge phase of dynamic node 108, even though the Boolean value of the logical function is "true", the dynamic logic gate dissipates power even when the input signal states are unchanged.

Dynamic logic may use a footer NFET 106 or not. In the case the footer NFET 106 is not used, the inputs A, B, and C must be timed to be valid during the evaluate phase of Clk 104. Regardless, dynamic circuits rely on the ability to precharge the dynamic node to a logic one state in advance of having valid logic inputs valid. In logic circuitry with a wide input fan-in, there are many parallel paths in the form of one or more intermediate nodes that may be coupled to the dynamic node by one or more select devices. When a select device connects the intermediate nodes to the dynamic node, leakage current may make it difficult to hold the logic state on the dynamic node until the start of the evaluation cycle. This is especially true as device size decreases.

The sharp increase of leakage currents in scaled technologies severely limits the robustness of dynamic circuits, especially for high fan in wide dynamic gates, commonly employed in the performance critical units of high-performance microprocessors. A strong keeper is necessary in the pre-charged state or after the completion of evaluation to compensate for the larger leakage current and to hold the right state at the dynamic node. However, the use of a strong (large) keeper results in severe contention during the evaluation phase causing significant degradation of the performance. Recently, a "conditional keeper" technique has been proposed in the art where only a small fraction of the keeper is turned ON at the onset of the evaluation phase while a large fraction of the keeper is only turned ON after a delay time and only if the dynamic output remains at a logic one. This scheme reduces the contention during evaluation and thus improves the performance of the dynamic logic gate. Furthermore, the strong keeper improves the noise margin and robustness of the dynamic logic gate. Alternatively, a programmable keeper has been proposed where the effective width of the keeper is optimally programmed based on die leakage to compensate for variations in die-to-die leakage. While effective, both of these techniques result in increased area of the dynamic logic gate and added capacitance to the dynamic node which increase cost and reduce performance.

Therefore, there is a need for a dynamic logic gate with a keeper circuit that operates as a keeper during the evaluation cycle and a pre-charge device during the evaluation cycle that reduces the circuit area.

SUMMARY OF THE INVENTION

A dynamic logic gate has an asymmetrical dual-gate PFET device that operates as a pre-charge device during the pre-charge cycle and a keeper device during the evaluation cycle. The asymmetrical dual-gate PFET has its front gate coupled to the normal clock input and its back gate coupled to a voltage potential. During the pre-charge cycle of the clock, both the front and back gate are ON and the dynamic node is charged with maximum current as the back gate operates to modulate the front gate current. During the evaluation cycle, the back gate holds the dynamic node with a current level that is one tenth to one twentieth the precharge current. The NFET evaluation devices sink the keeper current if the dynamic node evaluates to a logic zero. If the dynamic node evaluates to a logic one, the back gate current keeps leakage current from discharging the dynamic node. During testing the clock is high and the dynamic gate operates as a pseudo-NMOS circuitry.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings in which.

DETAILED DESCRIPTION

Figure 1:
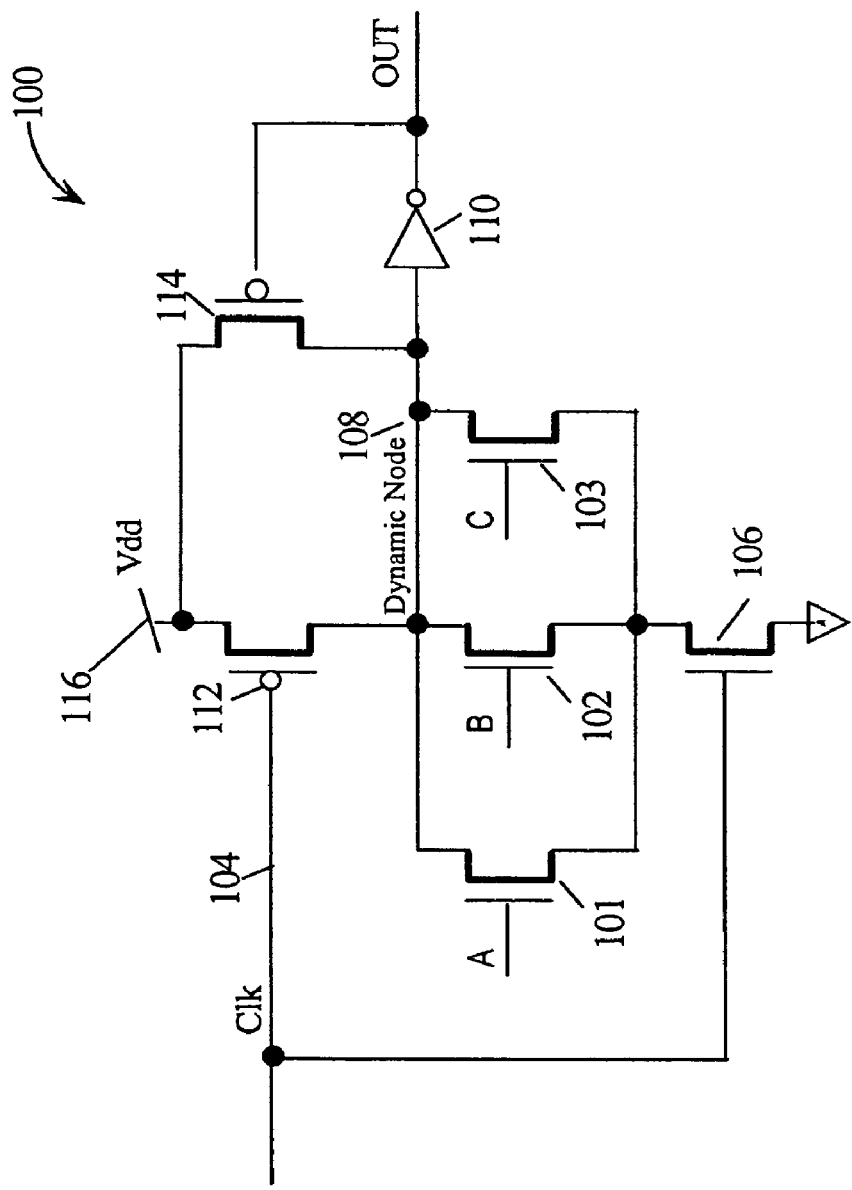
FIG. 1 is a circuit diagram of a dynamic logic gate configuration with conventional single gate FET devices and a half-latch keeper circuit.

In the following description, numerous specific details are set forth to provide a thorough understanding of the present invention. For example, specific logic functions and the circuitry for generating them may be described; however, it would be recognized by those of ordinary skill in the art that the present invention may be practiced without such specific details. In other instances, well-known circuits have been shown in block diagram form in order not to obscure the present invention in unnecessary detail. Refer now to the drawings wherein depicted elements are not necessarily shown to scale and wherein like or similar elements are designated by the same reference numeral by the several views.

Refer now to the drawings wherein depicted elements are not necessarily shown to scale and wherein like or similar elements are designated by the same reference numeral through the several views.

Dual or double gate FET devices have been described in the literature. Two references are included in the following which explain differing architectures of dual-gated FET devices including symmetrical and asymmetrical structures. These references explain details of these devices and the size and thus capacitance reduction that results from using a dual-gated FET device in place of two single gate FET devices in appropriate applications. The reader is referred to "Double-Gate CMOS: Symmetrical-Gate Versus Asymmetrical-Gate Devices" IEEE Transactions on Electron Devices, Vol. 48, NO. 2, February 2001 and "Novel High-Density Low-Power High-Performance Double-Gate Logic Techniques", IEEE International SOI Conference, 2004.

The separate, independent biasing of the front and back gate in double gate devices has been exploited to reduce the number of transistors required for implementing logic functions to improve the performance, power and area of the circuits. Prior art, however, is limited to the "logic" transistors, and not the "keeper" or intermediate node pre-charged device in the dynamic gate.

Figure 2:
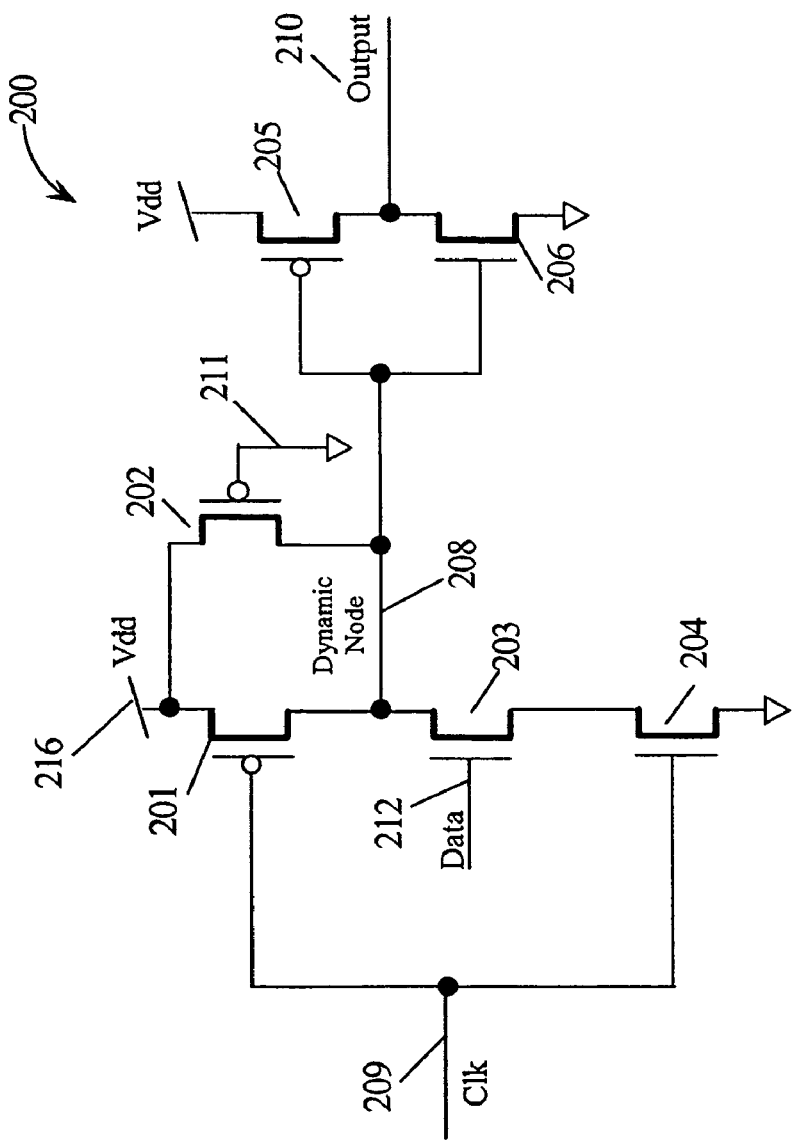
FIG. 2 is a circuit diagram of a dynamic logic gate configuration with an un-gated keeper device using a single gate FET device.

FIG. 2 is a circuit diagram illustrating a dynamic logic gate 200 powered by power supply voltage Vdd 216 and suitable for practicing principles of the present invention. Clk 209 has an pre-charge cycle and a evaluation cycle. When Clk 209 is a logic zero, PFET 201 turns ON and pre-charges dynamic node 208 to a logic one. Footer NFET 204 is turned OFF preventing a logic one state on input 212 from discharging dynamic node 208. During the evaluation cycle Clk 209 is a logic one and PFET 201 is turned OFF and NFET 204 is turned ON. Depending on the logic state of input 212, dynamic node 208 evaluates to either a logic zero or a logic one. If dynamic node 208 evaluates to a logic one, then keeper PFET 202 holds the pre-charge state during the evaluation cycle preventing leakage current from discharging the dynamic node 208. PFET 205 and NFET 206 form a static inverter that isolates the dynamic node and generates Output 210. Keeper PFET 202 is biased ON all the time by ground connection 211. If the dynamic node 208 evaluates to a logic zero, then NFETs 203 and 204 must sink the ON state current of PFET 202 during the evaluation cycle. PFET 202 is normally sized as a small device as it only has to overcome leakage current. PFET 212 is sized according to the number of parallel devices coupled to dynamic node 208.

Figure 3A:
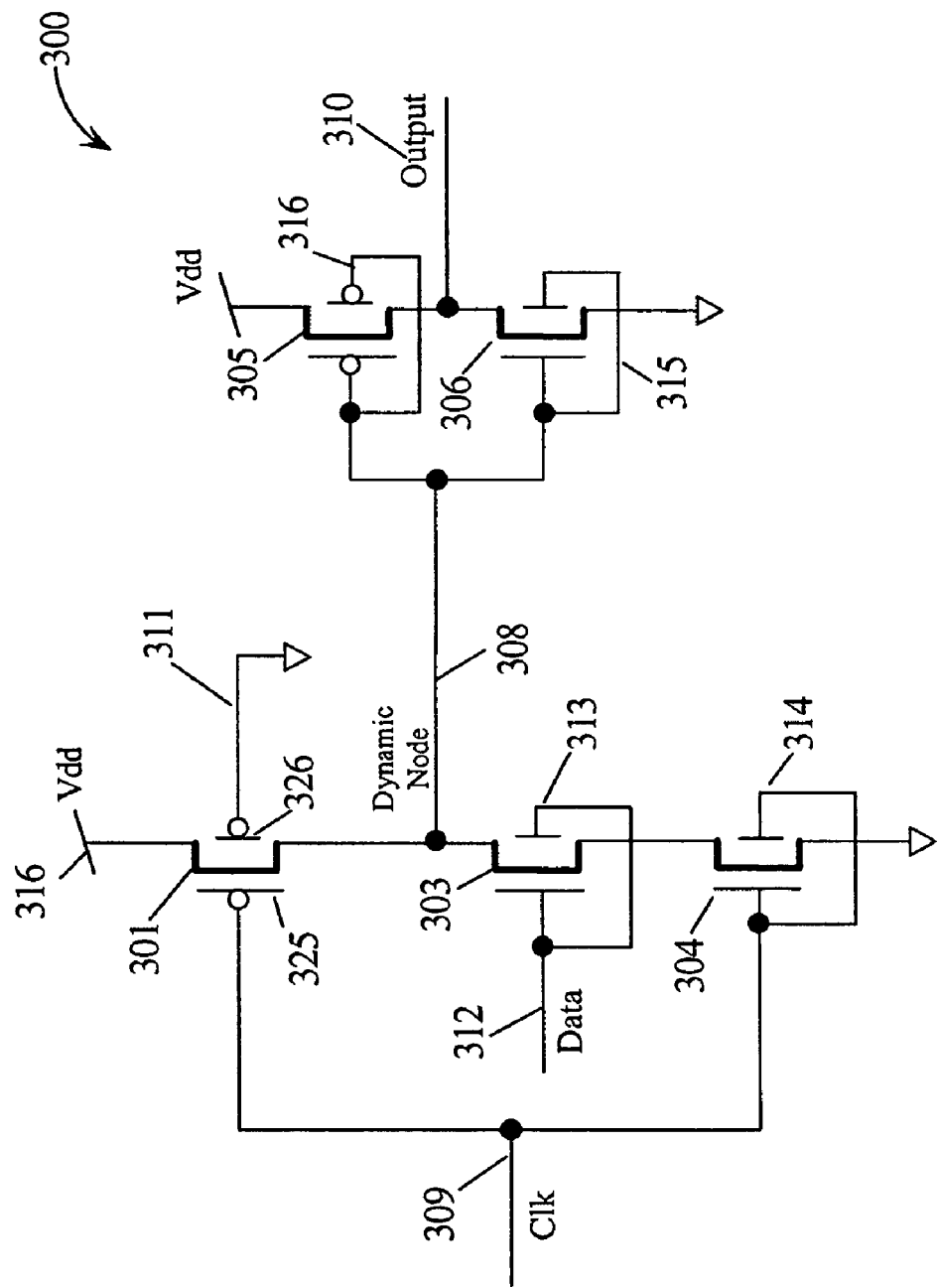
FIG. 3A is a circuit schematic of the dynamic logic gate of FIG. 2 implemented with dual-gate FET devices according to one embodiment of the present invention.

FIG. 3A is a dynamic logic gate 300 powered by Vdd 316 and configured using dual-gated FET devices according to embodiments of the present invention, in particular, using pre-charge dual-gated PFET 301. Asymmetrical dual-gate PFET 301 has two functions, it operates as the pre-charge device during the pre-charge cycle of Clk 309 and operates as the keeper device during the evaluation cycle of Clk 309 when the logic state of Data 312 is asserted on dynamic node 308. If dual-gate PFET 301 is an asymmetrical device, back gate 326 provides a weaker channel than front gate 325. However, the channel conduction produced by the front gate 325 is strongly influenced by the back gate 326. When the front gate 325 is ON and the back gate 326 is OFF the channel conduction is much lower than if both gates are ON. The conduction of the channel between the source and drain is modulated by the back gate 326 and the current when both front gate 325 and back gate 326 are ON is approximately twice the current when only front gate 325 is ON.

During the pre-charge cycle, Clk 309 is a logic zero and both front gate 325 and back gate 326 are a logic zero causing the channel of dual-gate PFET 301 to have the highest conduction and thus the highest current for pre-charging dynamic node 308. During the evaluation cycle, Clk 309 is a logic one and front gate 325 is a logic one and back gate 326 remains a logic zero by virtue of ground connection 311. In this case, the conduction current of dual-gate PFET 301 drops by at least an order of magnitude thus providing holding current to prevent the discharge of dynamic node 308 by leakage paths from the logic tree (e.g., NFET 313) coupled to the dynamic node. Since dual-gate PFET 301 is much smaller that two single gated PFETs (e.g., PFET 301 and 302 in FIG. 2) with the same function, logic gate 300 is smaller than logic gate 200 which has the same functionality. In fact, all of the FET devices in logic gate 300 are implemented as dual-gate FET devices to reap the benefits of reduced leakages afforded by the asymmetrical dual-gate FET structure.

The dynamic node 308 is isolated with a static inverter comprising NFET 306 with back/front gate connection 315 and PFET 305 with back/front gate connection 316. The output 310 is generated by the static inverting circuit.

Figure 3B:
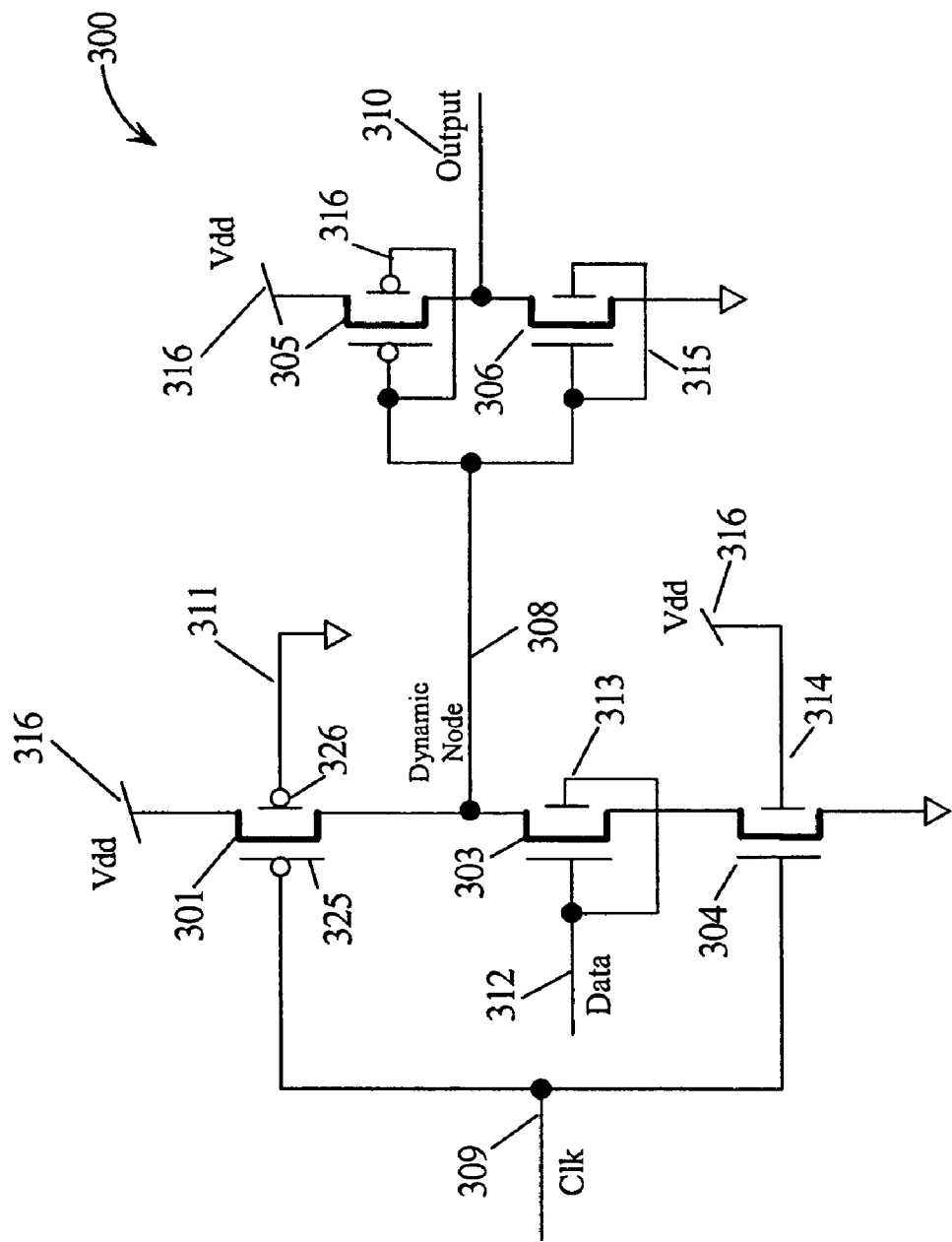
FIG. 3B is a circuit schematic of the dynamic logic gate of FIG. 2 implemented with dual-gate FET devices according to another embodiment of the present invention.

FIG. 3B is a logic gate 350 which is the same as the dynamic logic gate 300 of FIG. 3A with the exception that it is modified by coupling the gate of asymmetrical dual-gate NFET 304 to the positive power supply potential Vdd 316. As in FIG. 3A, asymmetrical dual-gate PFET 301 has two functions, it operates as the pre-charge device during the pre-charge cycle of Clk 309 and operates as the keeper device during the evaluation cycle of Clk 309 when the logic state of Data 312 is asserted on dynamic node 308. If dual-gate PFET 301 is an asymmetrical device, back gate 326 provides a weaker channel than front gate 325. However, the channel conduction produced by the front gate 325 is strongly influenced by the back gate 326. When the front gate 325 is ON and the back gate 326 is OFF the channel conduction is much lower than if both gates are ON. The conduction of the channel between the source and drain is modulated by the back gate 326 and the current when both front gate 325 and back gate 326 are ON is approximately twice the current when only front gate 325 is ON.

During the pre-charge cycle, Clk 309 is a logic zero and both front gate 325 and back gate 326 are a logic zero causing the channel of dual-gate PFET 301 to have the highest conduction and thus the highest current for pre-charging dynamic node 308. In this circuit configuration, the back gate 314 of NFET 304 is coupled to Vdd 316 to reduce the clock loading by one-half. However, when Clk 309 is a logic zero, NFET 304 will conduct the leakage current resulting from the back gate being biased ON with Vdd 316. It is important to note that the signals from a preceding stage (e.g., Data 312) are a logic zero during their pre-charge cycle. The dynamic node in each preceding dynamic stage, pre-charges to a logic one which the output static inverter converts to a logic zero. Therefore the NFET devices (e.g., NFET 313) in the logic tree are not conducting during the time NFET 304 would have leakage due to back gate 314 being tied to Vdd 316. The evaluation cycle and static inverter output stage of logic gate 350 is the same as described relative to logic gate 300 in FIG. 3A.

Figure 4:
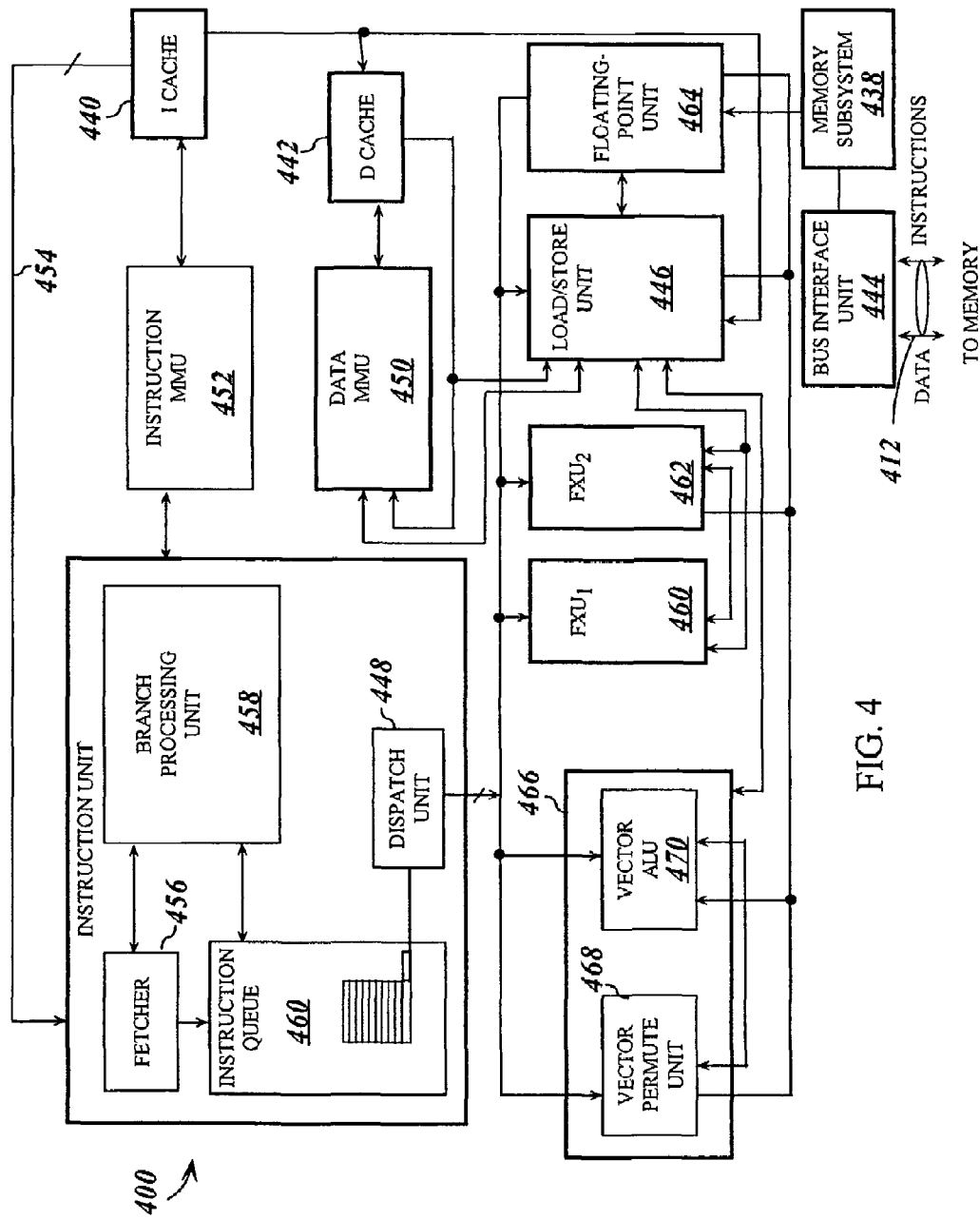
FIG. 4 illustrates a high level block diagram of selected operational blocks within a central processing unit (CPU) suitable for practicing principles of the present invention.

FIG. 4 is a high level functional block diagram of selected operational blocks that may be included in a central processing unit (CPU) 400. In the illustrated embodiment, CPU 400 includes internal instruction cache (I-cache) 440 and data cache (D-cache) 442 which are accessible to memory (not shown in FIG. 4) through bus 412, bus interface unit 444, memory subsystem 438, load/store unit 446 and corresponding memory management units: data MMU 430 and instruction MMU 432. In the depicted architecture, CPU 400 operates on data in response to instructions retrieved from I-cache 440 through instruction dispatch unit 448. Dispatch unit 448 may be included in instruction unit 434 which may also incorporate fetch unit 436 and branch processing unit 438 which controls instruction branching. An instruction queue 460 may interface fetch unit 436 and dispatch unit 448. In response to dispatched instructions, data retrieved from D-cache 442 by load/store unit 446 can be operated upon by one of fixed point unit (FXU) 460, FXU 462 or floating point execution unit (FPU) 464. Additionally, CPU 400 provides for parallel processing of multiple data items via vector execution unit (VXU) 466. VXU 466 includes vector permute unit 468 which performs permutation operations on vector operands, and vector arithmetic logic unit (VALU) 470 which performs vector arithmetic operations, which may include both fixed-point and floating-point operations on vector operands. VALU 470 may be implemented using a dynamic logic gate 300 or 350 in accordance with the present inventive principles. Other units may also employ dynamic logic gates configured like dynamic logic gate 300 or 350 according to embodiments of the present invention.

Although the present invention and its advantages have been described in detail, it should be understood that various changes, substitutions and alterations can be made herein without departing from the spirit and scope of the invention as defined by the appended claims.

What is claimed is:

1. A dynamic logic circuit receiving a clock signal and a plurality of logic inputs comprising:
    a dynamic node pre-charged in response to a pre-charge phase of a clock signal and a first voltage potential;
    a multi-gate field effect transistor (FET) device having a power terminal coupled to a second voltage potential greater than the first voltage potential, a front gate coupled to the clock signal, a back gate coupled to the first voltage potential, and a pre-charge terminal coupled to the dynamic node; and
    a logic tree for evaluating the dynamic node in response to a Boolean combination of logic signals coupled to the plurality of logic inputs and an evaluation phase of the clock signal.

2. The dynamic logic circuit of claim 1 further comprising a static logic circuit having an input coupled to the dynamic node and an output generating the logic output of the dynamic logic gate.

3. The dynamic logic circuit of claim 1, wherein the multi-gate FET device couples the dynamic node to the second voltage potential with a first conductivity in response to the pre-charge phase of the clock signal and the first voltage potential and couples the dynamic node to the second voltage potential with a second conductivity in response to the evaluate phase of the clock signal and the first voltage potential.

4. The dynamic logic circuit of claim 3, wherein the multi-gate FET device is a dual-gate PFET having a source coupled to the second voltage potential, a drain coupled to the dynamic node, the front gate coupled to the clock signal and the back gate coupled to the first voltage potential.

5. The dynamic logic circuit of claim 2, wherein the static logic circuit is a logic inverter having an input coupled to the dynamic node and generating a logic output of the dynamic logic circuit.

6. The dynamic logic circuit of claim 1, wherein the a multi-gate FET device operates as a keeper circuit holding a logic one pre-charge state of the dynamic node when the dynamic node evaluates to a logic one during the evaluation phase of the clock signal.

7. The dynamic logic circuit of claim 4, wherein the dual-gate PFET is an asymmetrical dual-gate PFET and a combination of the back gate and the front gate turns ON the dual-gate PFET with the first conductivity, the back gate turns ON the dual-gate PFET with the second conductivity and the first conductivity is greater than the second conductivity.

8. The dynamic logic circuit of claim 4, wherein the dual-gate PFET has P+ polysilicon for the front gate and N+ polysilicon for the back gate.

9. The dynamic logic circuit of claim 1 further comprising a multi-gate NFET as a footer device for coupling the logic tree to a voltage potential equal to less than the first voltage potential in response to the evaluation phase of the clock signal and the second voltage potential.

10. The dynamic logic circuit of claim 9, wherein the multi-gate NFET is an asymmetrical dual-gate NFET with an N+ polysilicon back gate coupled to the second voltage potential and a P+ polysilicon front gate coupled to the clock signal.

11. A data processing system comprising:
    a central processing unit (CPU); and
    a memory operable for communicating instructions and operand data to the CPU, wherein the CPU includes one or more dynamic logic circuits receiving a clock signal and a plurality of logic inputs and having a dynamic node pre-charged in response to a pre-charge phase of a clock signal and a first voltage potential, a multi-gate field effect transistor (FET) device having a power terminal coupled to a second voltage potential greater than the first voltage potential, a front gate coupled to the clock signal, a back gate coupled to the first voltage potential, and a pre-charge terminal coupled to the dynamic node, and a logic tree for evaluating the dynamic node in response to a Boolean combination of logic signals coupled to the plurality of logic inputs and an evaluation phase of the clock signal.

12. The data processing system of claim 11 further comprising a static logic circuit having an input coupled to the dynamic node and generating a logic output of the dynamic logic gate.

13. The data processing system of claim 12, wherein the multi-gate FET device couples the dynamic node to the second voltage potential with a first conductivity in response to the pre-charge phase of the clock signal and the first voltage potential and couples the dynamic node to the second voltage potential with a second conductivity in response to the evaluate phase of the clock signal and the first voltage potential.

14. The data processing system of claim 13, wherein the multi-gate FET device is a dual-gate PFET having a source coupled to the second voltage potential, a drain coupled to the dynamic node, the front gate coupled to the clock signal and the back gate coupled to the first voltage potential.

15. The data processing system of claim 12, wherein the static logic circuit is a logic inverter having an input coupled to the dynamic node and an output generating the logic output of the dynamic logic circuit.

16. The data processing system of claim 11, wherein the a multi-gate FET device operates as a keeper circuit holding a logic one pre-charge state of the dynamic node when the dynamic node evaluates to a logic one during the evaluation phase of the clock signal.

17. The data processing system of claim 14, wherein the dual-gate PFET is an asymmetrical dual-gate PFET and a combination of the back gate and the front gate turns ON the dual-gate PFET with the first conductivity, the back gate turns ON the dual-gate PFET with the second conductivity and the first conductivity is greater than the second conductivity.

18. The data processing system of claim 14, wherein the dual-gate PFET has P+ polysilicon for the front gate and N+ polysilicon for the back gate.

19. The data processing system of claim 11 further comprising a multi-gate NFET as a footer device for coupling the logic tree to a voltage potential equal to less than the first voltage potential in response to the evaluation phase of the clock signal and the second voltage potential.

20. The data processing system of claim 19, wherein the multi-gate NFET is an asymmetrical dual-gate NFET with an N+ polysilicon back gate coupled to the second voltage potential and a P+ polysilicon front gate coupled to the clock signal.

* * * * *